(12) United States Patent
Bibee

(10) Patent No.: US 8,792,250 B2
(45) Date of Patent: *Jul. 29, 2014

(54) APPARATUS FOR FLEXIBLE MOUNTING AND ELECTRICAL CONNECTION

(71) Applicant: Cree, Inc., Durham, NC (US)

(72) Inventor: Gregory S. Bibee, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/718,589

(22) Filed: Dec. 18, 2012

(65) Prior Publication Data

US 2013/0107480 A1    May 2, 2013

Related U.S. Application Data

(62) Division of application No. 12/574,918, filed on Oct. 7, 2009, now Pat. No. 8,379,407.

(51) Int. Cl.
| | |
|---|---|
| *H05K 1/11* | (2006.01) |
| *H05K 1/14* | (2006.01) |
| *H01R 12/70* | (2011.01) |
| *F21V 19/00* | (2006.01) |
| *H05K 1/18* | (2006.01) |
| *H05K 3/36* | (2006.01) |
| *H05K 3/30* | (2006.01) |
| *F21Y 101/02* | (2006.01) |

(52) U.S. Cl.
CPC .............. *H05K 1/18* (2013.01); *H01R 12/7082* (2013.01); *H05K 2201/10106* (2013.01); *H05K 2201/10681* (2013.01); *H05K 1/147* (2013.01); *F21V 19/005* (2013.01); *H05K 3/363* (2013.01); *H05K 3/305* (2013.01); *H05K 1/141* (2013.01); *F21Y 2101/02* (2013.01)
USPC ........... 361/803; 361/749; 361/763; 361/782; 361/784; 174/254

(58) Field of Classification Search
USPC .......................... 361/749–750, 782–784, 803; 174/254–261; 362/249.01–249.02
See application file for complete search history.

(56) References Cited

U.S. PATENT DOCUMENTS

| | | | | |
|---|---|---|---|---|
| 6,617,518 | B2 * | 9/2003 | Ames et al. .................... | 174/254 |
| 7,030,477 | B2 * | 4/2006 | Ishimura ........................ | 257/678 |
| 7,140,751 | B2 * | 11/2006 | Lin ............................ | 362/249.02 |
| 2004/0195975 | A1 * | 10/2004 | Fregoso ......................... | 315/219 |
| 2007/0253198 | A1 * | 11/2007 | Pelegrin ........................ | 362/246 |

* cited by examiner

*Primary Examiner* — Tuan T Dinh
(74) *Attorney, Agent, or Firm* — Law Offices of Peter H. Priest, PLLC

(57) ABSTRACT

A connector for connecting surface mount devices, such as light emitting diodes (LEDs), to printed circuit boards (PCBs). The connector may be prepackage with an LED assembly or on a PCB to which the LED assembly will be mounted. Connection complexity can be moved from the PCB to the connector, and LED assemblies may be customized differently for different customers. One to many and many to one connections are readily supported with variations on the connector.

20 Claims, 12 Drawing Sheets

APPARATUS FOR FLEXIBLE MOUNTING AND ELECTRICAL CONNECTION

RELATED APPLICATION

This application is a continuation of U.S. patent application Ser. No. 12/574,918 entitled "Methods and Apparatus for Flexible Mounting and Electrical Connection" filed on Oct. 7, 2009 which is hereby incorporated by reference in its entirety.

FIELD OF THE INVENTION

The present invention relates generally to improvements in the field of physical mounting and electrical connection arrangements for semiconductor devices, such as light emitting devices, and, in particular, to methods and apparatus for improving the flexibility of light emitting device mounting and electrical connection arrangements.

BACKGROUND OF THE INVENTION

FIGS. 1A, 1B, 1C and 1D illustrate a standard LED packaging arrangement, such as that employed by the XLamp® 7090 XR-E series of LED products manufactured by Cree, Incorporated, and how that packaged LED lamp may be suitably mounted on a larger printed circuit board (PCB). As seen in FIG. 1A, the packaged LED lamp 100 comprises a lens 102, a reflector 104 and a mounting substrate 106. The arrangement 100 may also be referred to as an LED, LED lamp or a lamp. As seen in FIG. 1B, an LED chip 108 is electrically connected by bond wires 110 and 112 to electrical contact strips 114 and 116, respectively, on the substrate 106 which may suitably be a printed circuit board (PCB), such as a flame resistant 4 (FR4) board. When power is applied through the contacts 114 and 116, chip 108 emits light. The chip 108 is shown as having two top contacts for a chip having a horizontal arrangement. However, alternative LED chips and chip mounting arrangements are possible where the LED has a horizontal or vertical orientation or is flip chip mounted, as would be understood by one of ordinary skill in the art. In the arrangement shown, reflector 104 helps direct the emitted light upwards and the lens 102 focuses the emitted light. The chip 108 is thermally mounted on top surface 118 of substrate 106 with a thermal bonding paste. FIG. 1C shows a bottom surface 120 of the substrate 110 and electrical contacts 114 and 116 along with representative dimensions for the XLamp® 7090 XR-E series of LED products. It will be recognized that 9.0 mm is slightly smaller than 1 cm and is about ⅓ of an inch. As a result, it can be seen that the XLamp® LED products and other similar products have a small form factor compared to typical incandescent bulbs. FIG. 1D shows a solder pad 120 for mounting the packaged LED lamp 100 to a larger PCB.

Reflow surface mount techniques are highly efficient for lamps, such as lamp 100 where bottom contacts 114 and 116 can be reflow soldered to traces of a printed circuit board. However, as LED lamps become more complex with larger numbers of contacts and chips being employed, for example, and a much wider array of different applications, as such lamps are more widely adopted, additional flexibility as to physical mounting and electrical connection arrangements is highly desirable.

For example, two applications assigned to the assignee of the present application address aspects of such needs. See, for example, U.S. application Ser. No. 11,614,261 filed Dec. 21, 2006 and issued as U.S. Pat. No. 7,549,786 and U.S. application Ser. No. 12/335,631 filed Dec. 16, 2009, both of which are incorporated by reference herein in their entirety.

SUMMARY OF THE INVENTION

The present invention recognizes and anticipates that more complex lamps with additional electrical contacts will present both connection and heat dissipation issues. Further designs where top contacts are desirable or required, and the like, present additional connection problems. In this context, the present invention recognizes that further additional flexible mounting techniques are highly advantageous. Among its several aspects, the present invention provides flexible connection arrangements as described further herein. Among the several advantages of such arrangements, the contacts of a connector can be modified to adapt a standard LED lamp as desired by a particular customer or customers to customize that lamp for the particular customer and the particular application. Thus, purely as an illustrative example, one customer might want to drive a string or strings of an LED lamp with the same current. Another, might want drive each line individually with a different predetermined drive current. Finally, a third might want to vary the drive current on a line by line basis. Additional advantages may include the simplification of board layout, allowing for populating or depopulating a board based on needs of lighting designers, and ease of manufacture by reducing the number of connectors to one as opposed to one or more for each LED. Connection arrangements such as those described herein facilitate such variations.

According to one aspect, a connector for physically and electrically connecting a light emitting device to a printed circuit board is provided. The connector comprises a stiff body shaped to help mount the light emitting device to the printed circuit board; a first plurality of exposed electrical contacts corresponding to electrical contacts on the light emitting device; a second plurality of exposed electrical contacts corresponding to electrical contacts on the printed circuit board; and electrical connections connecting the first plurality of exposed electrical contacts to the second plurality of exposed contacts.

According to another aspect, a connector and LED lamp package is provided. The package comprises an LED lamp mounted on a substantially planar mounting board having electrical contacts on a top surface; a connector for electrically connecting the electrical contacts of the LED lamp to corresponding electrical traces of a printed circuit board. The connector comprises a first plurality of exposed electrical contacts corresponding to the electrical contacts on the top surface of the LED lamp; a second plurality of exposed electrical contacts corresponding to where electrical contacts on a printed circuit board are to be; and electrical connections connecting the first plurality of exposed electrical contacts to the second plurality of exposed contacts. The first plurality of electrical contacts of the connector are soldered to the electrical contacts of the LED lamp to form an integrated package.

According to a further aspect, a board and connector package is provided. The package comprises a printed circuit board with electrical contacts for providing drive current to contacts of an LED lamp; a connector for electrically connecting the electrical contacts of the printed circuit board to the contacts of the LED lamp. The connector comprises a first plurality of exposed electrical contacts corresponding to the electrical contacts of the LED lamp; a second plurality of exposed electrical contacts corresponding to electrical contacts on the printed circuit board; and electrical connections connecting the first plurality of exposed electrical contacts to the second plurality of exposed contacts. The second plurality of contacts of the connector are soldered to the electrical contacts of the printed circuit board to form an integrated package.

These and other advantages and aspects of the present invention will be apparent from the drawings and Detailed Description which follow.

DETAILED DESCRIPTION

Figure 2:
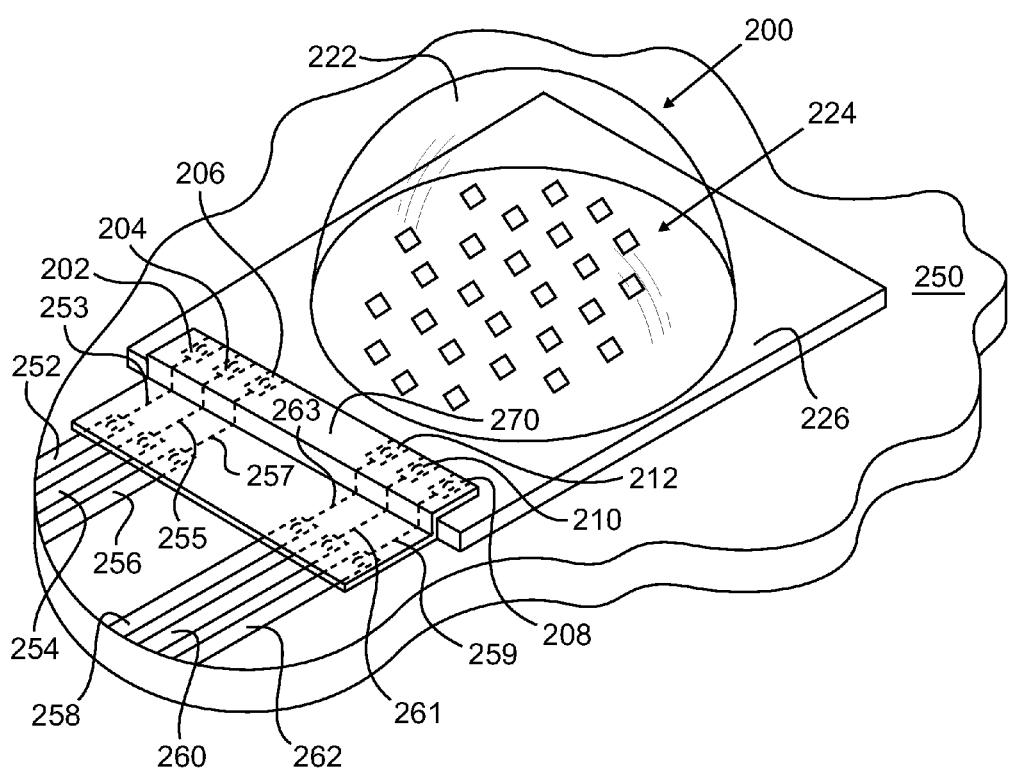
FIG. 2 illustrates a perspective view of a connector and mounting arrangement in accordance with a first embodiment of the present invention.

FIG. 2 illustrates a connector and mounting arrangement in accordance with a first embodiment of the present invention. It shows a packaged LED lamp 200 with multiple top contacts 202, 204, 206, 208, 210 and 212 shown in dashed lines. The lamp 200 further comprises a lens 222 and a mounting substrate 226 which may suitably be a printed circuit board (PCB), such as a flame resistant 4 (FR4) board. The arrangement 200 may also be referred to as an LED, LED lamp or a lamp. The lamp 200 includes three strings of LED chips 224. Each string of LEDs has a cathode and anode contact comprising a pair of the contacts 202-212. It will be recognized that single chip LED lamps, multiple chip lamps with all chips at the same wavelength, multiple chip lamps with chips of different wavelengths and lamps with strings of chips all exist so that myriad contact and drive current requirements are presented. As examples, see U.S. application Ser. No. 12/154,691 filed May 23, 2008 and Ser. No. 12/288,957 filed Oct. 28, 2008, which are assigned to the assignee of the present application, and incorporated by reference herein in their entirety. The present invention provides flexibility in adapting to the many existing arrangements, and for adapting as future designs evolve.

The lamp 200 is shown mounted on a larger printed circuit board 250 which is shown cutaway in FIG. 2 for ease of illustration. A connector 270 connects the contacts 202-212 to respective electrical connections or traces 252, 254, 256, 258, 260 and 262 on the printed circuit board 250 utilizing conductive connections 253, 255, 257, 259, 261 and 263 which are part of the connector 270. Connector 270 may suitably comprise a flexible or moldable material that can be modified or manufactured to include electrical connections suitable for carrying the current needed by the lamp or lamps utilized by an application. Other examples are a stiff metal bent or otherwise shaped as needed with electrically isolated connectors thereon. Heat resistive plastic or ceramic with electrically isolated conductive traces may also be employed.

Figure 1A:
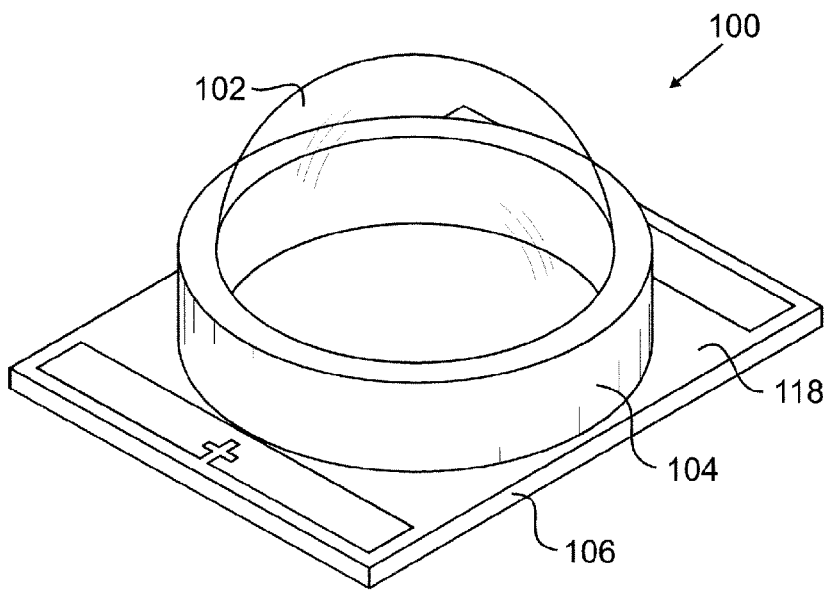
FIGS. 1A, 1B and 1C show a top perspective, a top, and a bottom view, respectively, of a typical prior art mounting arrangement for mounting an LED on a flame resistant (FR) 4 board.
Figure 1B:
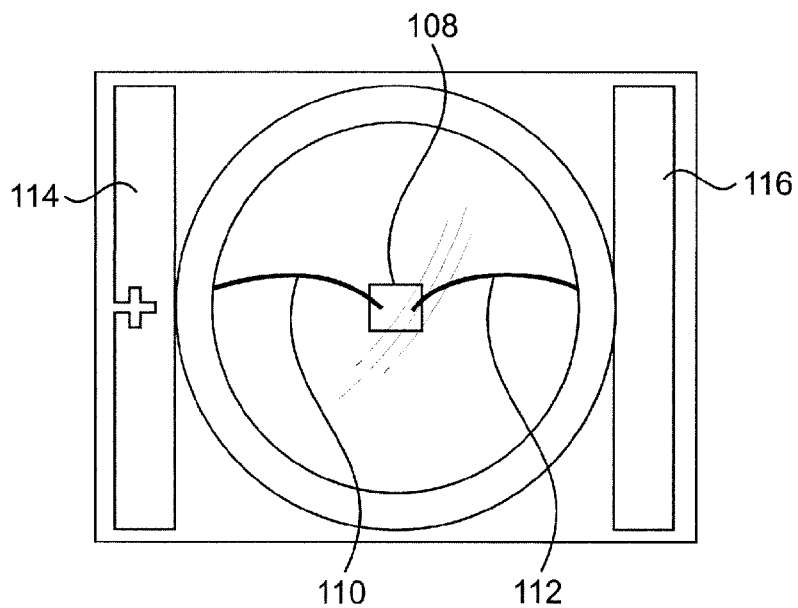
Figure 1C:
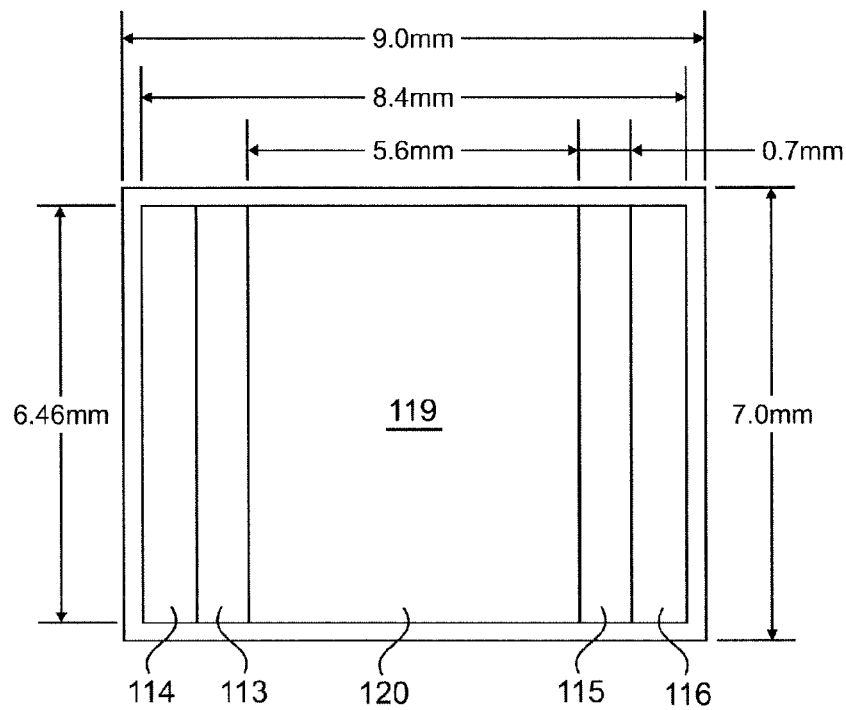
Figure 1D:
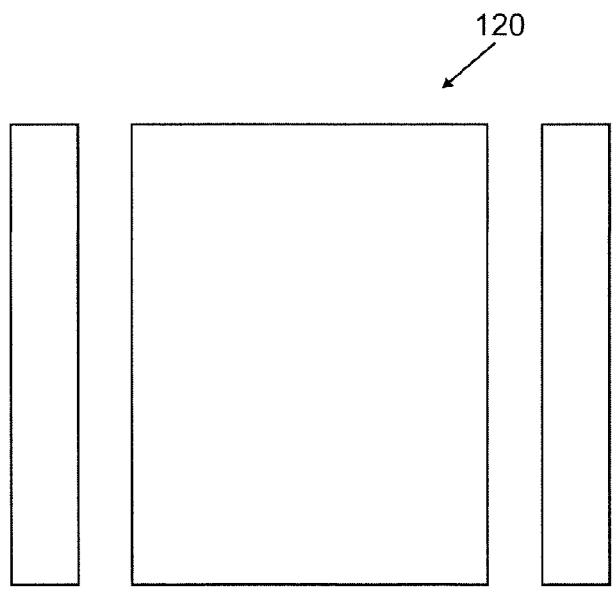
FIG. 1D shows a printed circuit board (PCB) solder pad for mounting the LED lamp package of FIGS. 1A-1C to a larger PCB board for a particular application.

As shown in FIG. 2, the connector 270 is reflow soldered to both the contacts of the lamp 200 and the traces of the printed circuit 270 in a single step after board 226 of lamp 200 has been reflow solder mounted to the printed circuit board 270. Several advantages can result from employing this approach of the present invention. First, because top contacts are employed for electrical connection of the lamp 200, the entire bottom surface of board 226 can be employed for thermal dissipation. By contrast, when the bottom contacts shown in FIG. 1C are employed, electrical isolation strips 113 and 115 isolate the electrical contacts 114 and 116 from thermal pad 119 effectively reducing the surface area employed for thermal dissipation. Second, the single connector 270 eliminates the need for soldering multiple individual connecting wires or packages of wires.

Figure 3A:
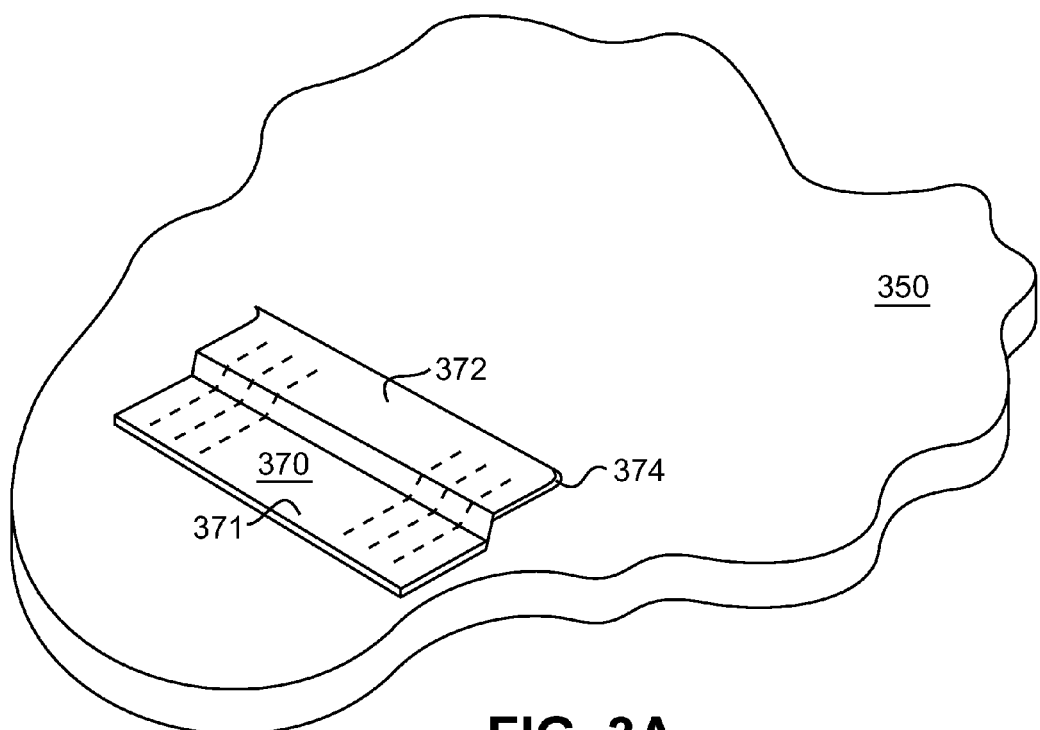
FIGS. 3A, 3B and 3C illustrate a perspective view of an alternative mounting arrangement in which a connector in accordance with the present invention is preapplied to a printed circuit board, as well as, bottom views of two anus of the connectors.
Figure 3B:
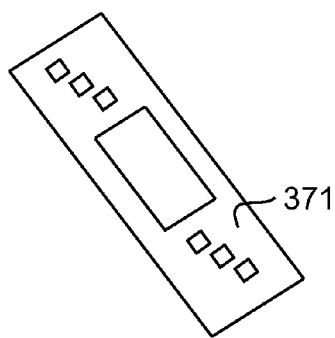
Figure 3C:
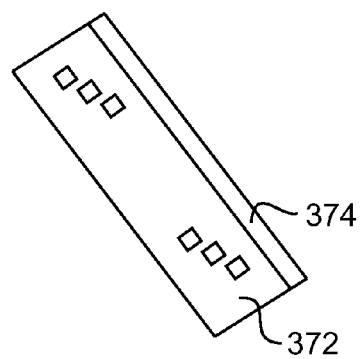

As an alternative to the arrangement shown in FIG. 2, as seen in FIG. 3A, a connector 370 can be premounted on a substrate 350 so that a connector-substrate package is formed. By adding a bend downward in arm 372 of connector 370 which ends in an upward curve 374, a spring tension can be generated which will help physically hold a lamp, such as lamp 200 on the substrate 350. The curve 374 also helps guide the lamp 200 so it slides into place under arm 372. As so designed, the connector is effectively a spring providing mechanical stability and reliable electrical contact. In some instances, such as building test samples to test a lamp, it will be recognized that a thermal paste may be employed between a lamp to be tested and the printed circuit board 350 to provide effective thermal dissipation, but the lamp may be simply held in place by the spring force provided by connector 370 rather than reflow soldered in place. Such an arrangement allows for ready replaceability of lamps, upgradeability, and the like. FIGS. 3B and 3C show bottom views of arms 371 and 372 of connector 370 with illustrative solder pads preformed or pre-reflowed thereon.

Figure 4:
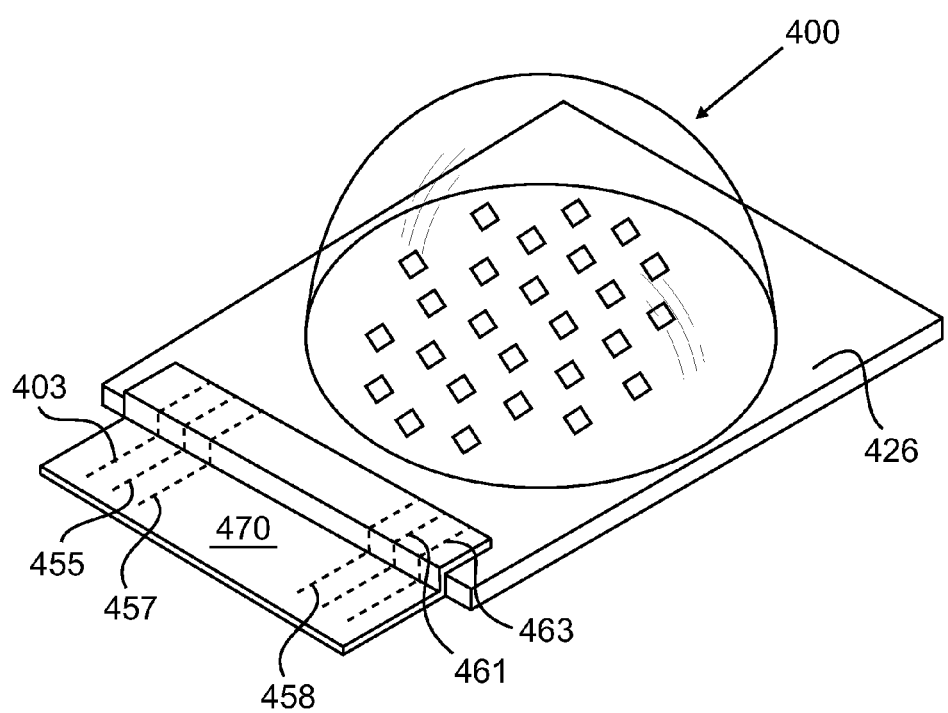
FIG. 4 illustrates a perspective view of an alternative mounting arrangement in which a connector in accordance with the present invention is preapplied to a lamp mounting board.
Figure 8:
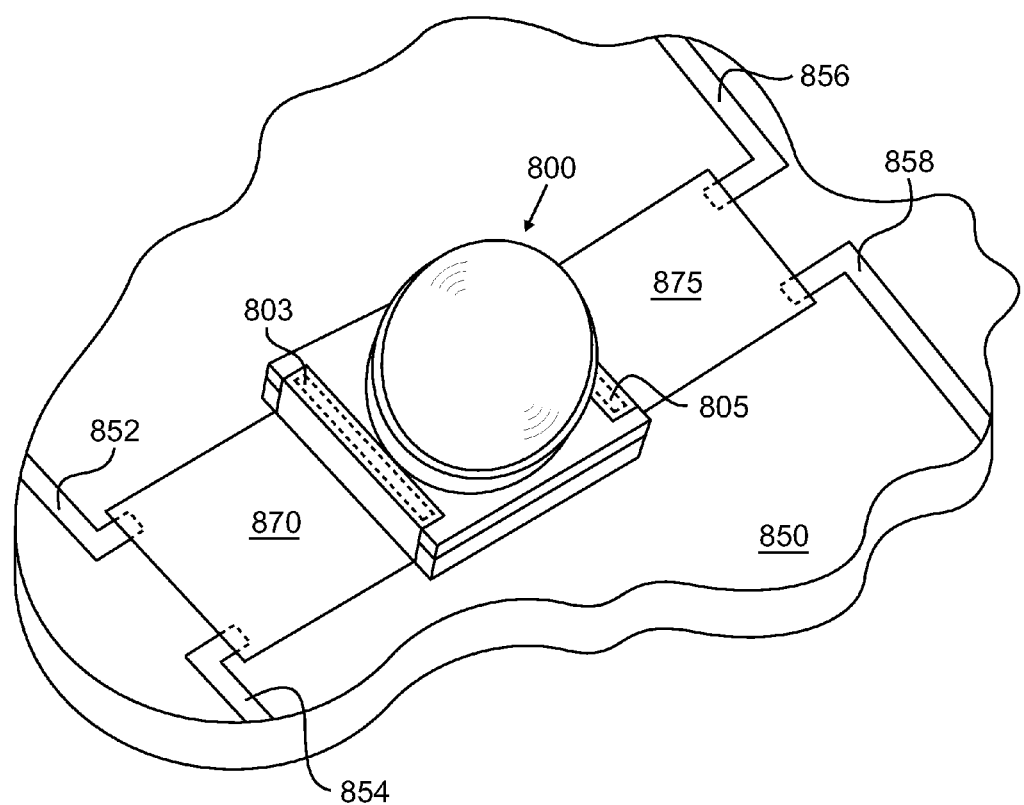
FIG. 8 illustrates a perspective view of connectors in accordance with the present invention utilized to adapt a smaller LED lamp for use with an existing printed circuit board with electrical traces for a larger lamp.

As a further alternative to the arrangement shown in FIG. 2, as seen in FIG. 4, a connector 470 can be premounted on a substrate 426 of a lamp 400 so that a connector-lamp package or formed. FIG. 4 illustrates an array of chips 420 connected in three strings as discussed above in connection with FIG. 2. Among its several advantages, this mounting arrangement of FIG. 4 can be utilized to mount a smaller lamp on a landing pad on a presently printed circuit board for a larger lamp by extending the contacts outwardly from the lamp to meet existing power traces, as seen in FIG. 8, for example.

Figure 5:
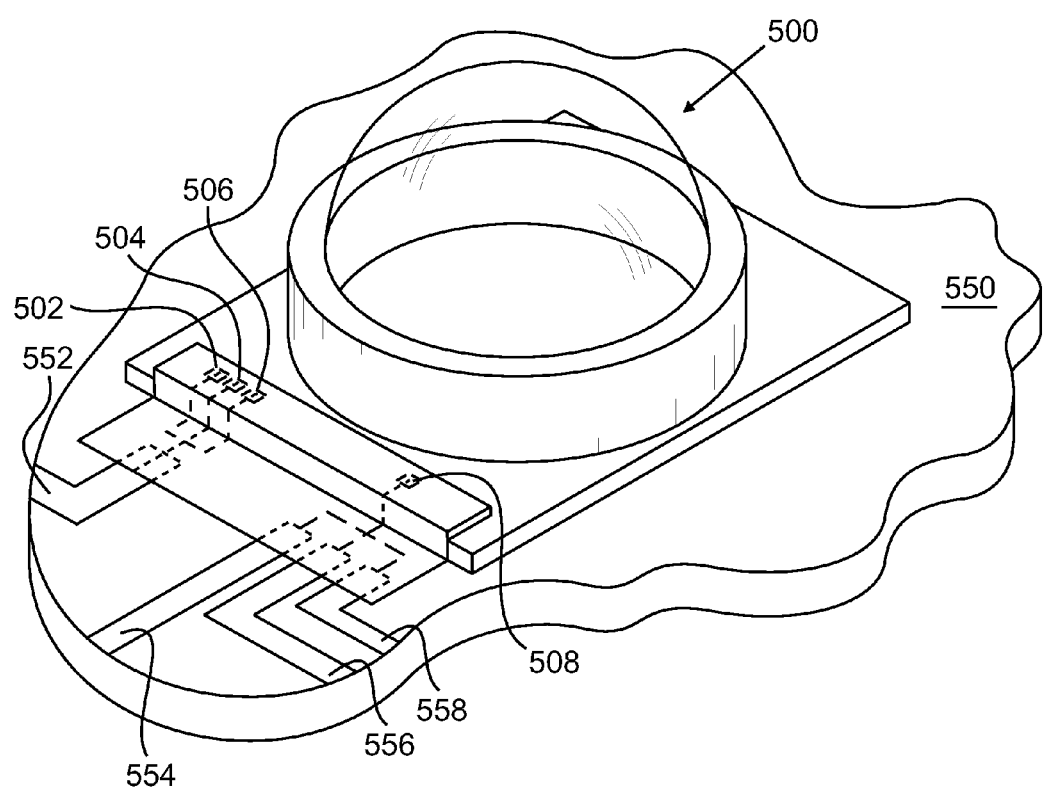
FIG. 5 illustrates an arrangement in which a connector in accordance with the present invention provides multiple to one and one to multiple connectivity.

While FIG. 2 illustrates an arrangement in which multiple contacts 202-212 are connected to multiple traces 252-262, the present invention also provides a ready technique for connecting multiple contacts 502, 504 and 506 of a lamp 500 to a single trace 552 on a printed circuit board 550 or for connecting a single contact 508 to multiple traces 554, 556 and 558 on the printed circuit board 550 as illustrated in FIG. 5. This approach serves the general purpose of moving wiring complexity off the printed circuit board or off the LED lamp board and onto the connector. More particularly, the multiple lamp contacts to one printed circuit board trace connection is advantageously employed where it is desired to drive three different LEDs or strings of LEDs with the same drive current. In a similar vein, the single lamp contact to multiple printed circuit board traces connections is advantageously employed where it is desired to drive the same LED or string of LEDs with a different drive current to achieve different lighting effects. In an alternative embodiment, the adaptive connector of the present invention can be used to connect M contacts on a board 550 to N contacts on an LED lamp where M and N are greater than or equal to one and M is not equal to N. Depending on the embodiment, M can be equal to N.

Figure 6:
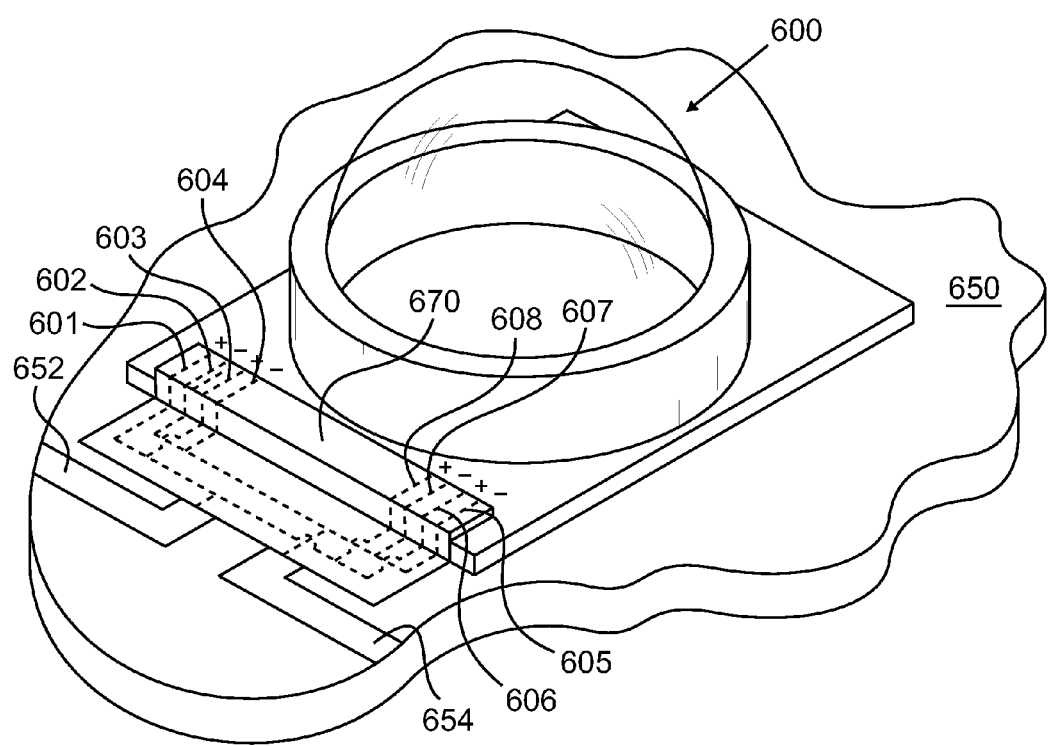
FIG. 6 illustrates an arrangement in which a connector in accordance with the present invention simplifies connections by internal rerouting.

FIG. 6 shows a further arrangement in which an LED lamp 600 has four cathodes 601, 603, 605 and 607 and four anodes 602, 604, 606 and 608 are interleaved and a connector 670 serves to simplify the trace arrangement on printed circuit (PCB) board 650 by deinterleaving them so that the cathodes connect to one trace 652 and the anodes connect to one trace 654 on PCB 650.

Figure 7:
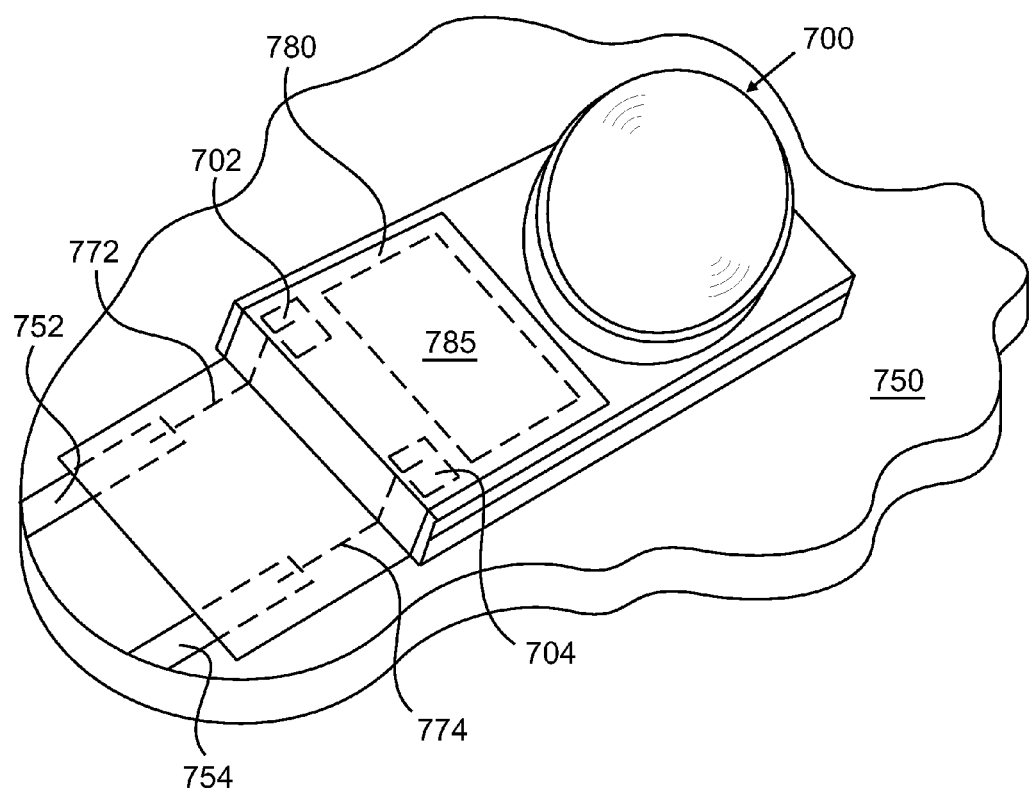
FIG. 7 illustrates a perspective view in which a connector in accordance with the present invention applies spring pressure to insure good mechanical and electrical connection and additionally provides added thermal dissipation.

FIG. 7 shows a further arrangement in which an LED lamp 700 has two contacts 702 and 704 connected by electrical connectors 772 and 774 in a connector 770 to electrical traces 752 and 754 on a PCB 750. In this embodiment, arm 780 of connector 770 has been extended in size to increase the mechanical support of lamp 700. In addition, an insert 785 has been provided to increase the thermal dissipation of heat from lamp 700. Insert 785 may suitably be aluminum, copper or another material with good heat dissipation properties. While an approach utilizing an insert is described, that approach is exemplary of a wide range of approaches to utilize a connector, such as the connector 770 to provide additional heat dissipation.

As shown in FIG. 8, two connectors 870 and 875 can be utilized to adapt an LED lamp 800 with a given footprint to fit an existing printed circuit board 850 designed for another LED device. More particularly, LED lamp 800 has a smaller footprint than the LED lamp for which board 850 was originally designed. For example, an LED lamp having a ceramic submount with top side contacts can be converted into or at least compatible with an LED package having leads, such as would be used in a lead frame based LED lamp with a molded plastic body encapsulating the lead frame with extended leads. Alternatively, lead frame based LED lamp package with molded plastic body can be converted into or be compatible with a LED package having top side contacts. As would be understood by one of ordinary skill in the art with the benefit of this disclosure, other conversions between different style packages is possible.

As seen in FIG. 8, connectors 870 and 875 extend from contacts 803 and 805 on the smaller footprint LED lamp 800 to an existing set of traces 852, 854, 856 and 858 on the printed circuit board 850 originally designed for the larger LED. In this embodiment, the two connectors 870 and 875 may be reflow soldered to the LED lamp 800 to form a connector-lamp package which is then in turn reflow soldered to the PCB 850 and the traces 852-856 for contexts such as a high throughput manufacturing environment.

Alternatively, in a context such as a device demonstration or evaluation environment, the connectors 870 and 875 may be reflow soldered to the PCB 850 to form a connector-board package, and with the spring arrangement illustrated in FIG. 3, for example, the LED lamp 800 may simply be slid into place beneath the connectors 870 and 875 with the spring force downward from these connectors ensuring good mechanical and electrical contact.

Such an arrangement advantageously allows the devices with similar footprints and electrical contacts to be compared in a first one and them the other test so viewers can gauge the performance of the two. With a smaller LED lamp, the approach allows a side by side comparison with larger LED lamps utilizing the same board without the need to make up a different board with different electrical traces.

Figure 9A:
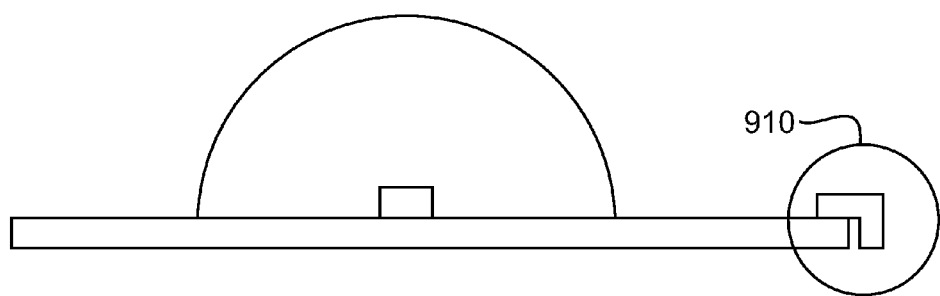
FIGS. 9A and 9B illustrate side and cutaway views of a small footprint connector in accordance with the present invention.
Figure 9B:
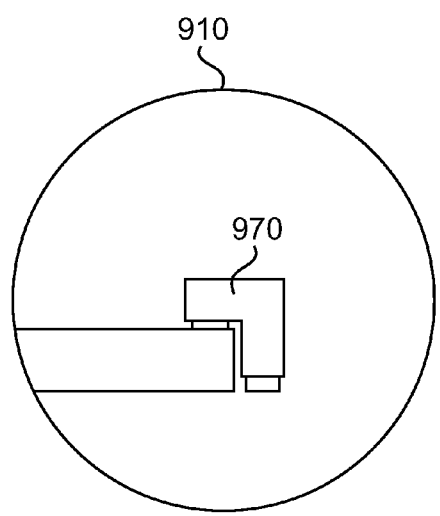

FIGS. 9A and 9B illustrate side and cutaway views of a further connector 970 having a small footprint.

Figure 10A:
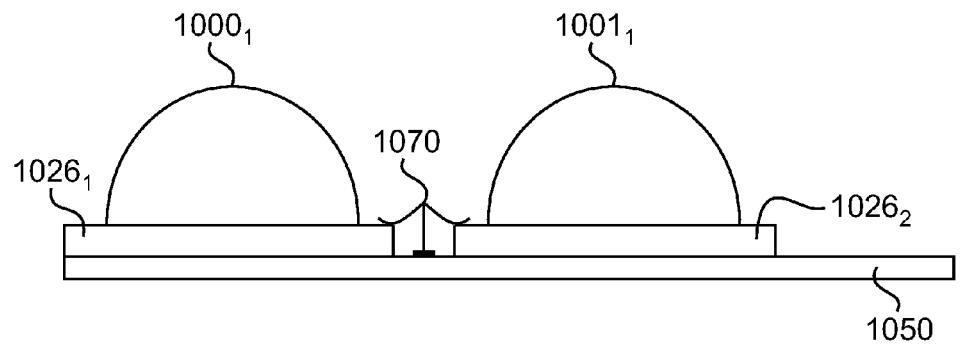
FIGS. 10A and 10B illustrate side and top views of a small footprint connector connecting multiple LED lamps to a printed circuit board.
Figure 10B:
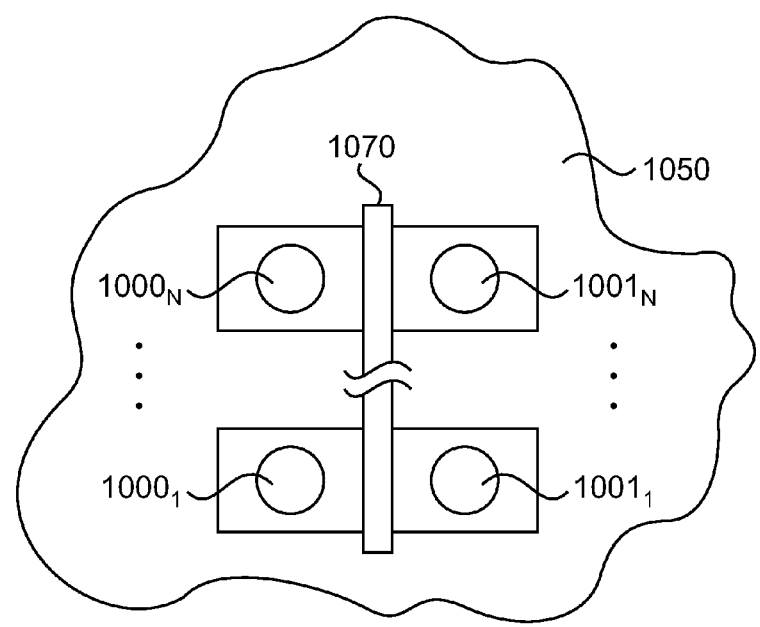

FIGS. 10A and 10B illustrate side and top views of a two sided connector 1070 for connecting multiple lamps $1000_{1-N}$ and $1001_{1-N}$ utilizing the one connector 1070 in accordance with the present invention resulting in a dramatic reduction in connectors as compared with one or more per lamp. As seen in FIG. 10A, lamps, such as lamps $1000_1$, and $1001_1$, having substrates 1026, and 1027, are located on either side of the connector 1070 with their electric contacts connected to corresponding contacts on a printed circuit board (PCB) 1050 by the connector 1070. As illustrated in FIG. 10B, by extending the length of the connector 1070, a number of lamps, N, can be connected to the PCB 1050 thereby.

Figure 11:
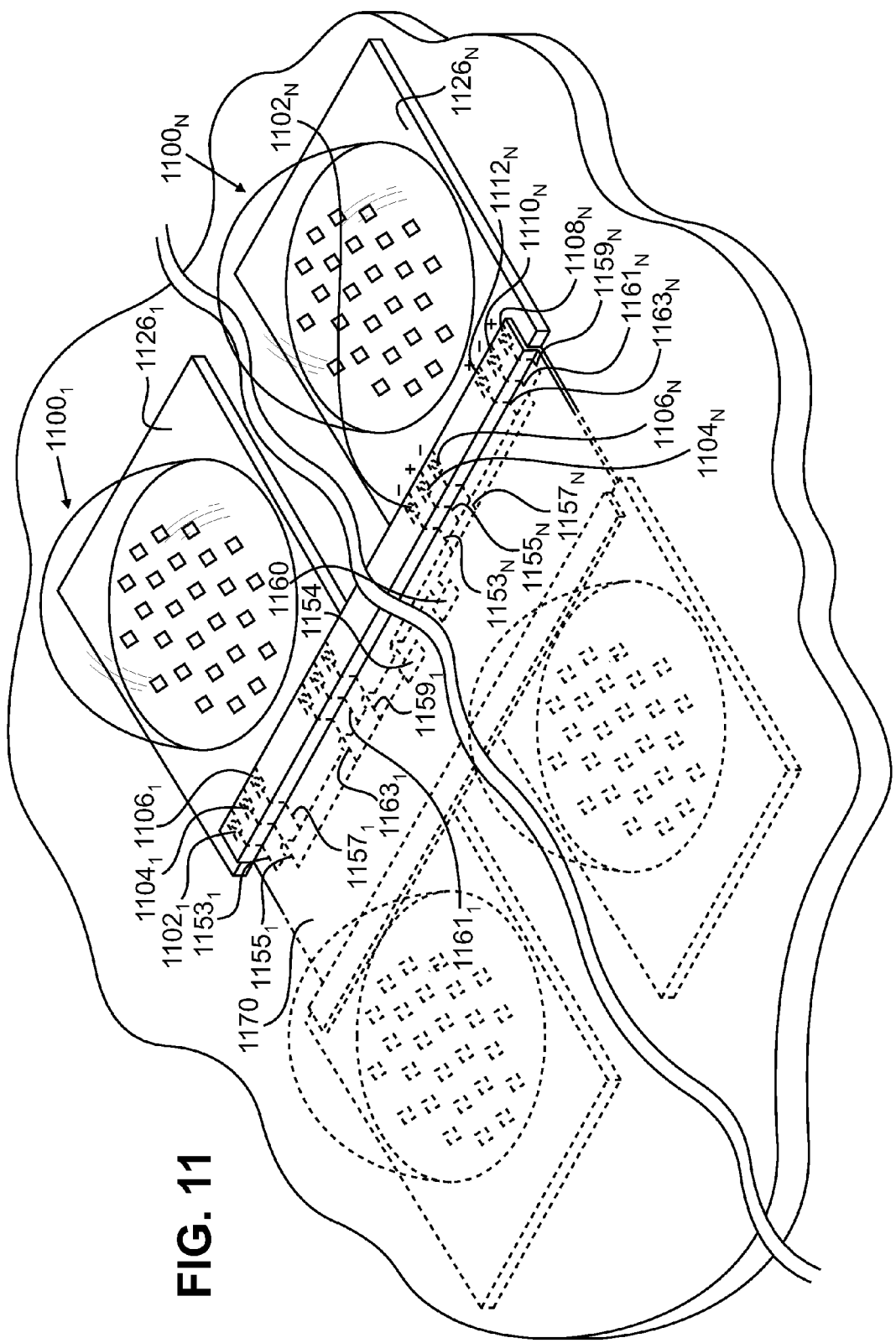
FIG. 11 illustrates a perspective view of a further connector for connecting multiple lamps.

FIG. 11 illustrates a connector and mounting arrangement in accordance with a further embodiment of the present invention. FIG. 11 shows an arrangement with mirrored left and right halves. For ease of illustration only the right half is shown in detail. Right half of FIG. 11 comprises packaged LED lamps $1100_1$-$1100_N$ (collectively 1100) with multiple top contacts $1102_1$-$1102_N$, $1104_1$-$1104_N$, $1106_1$-$1106_N$, $1108_1$-$1108_N$, $1110_1$-$1110_N$, and $1112_1$-$1112_N$ (collectively 1102-1112) shown in dashed lines. Lamps $1100_1$-$1100_N$ further comprise lenses and mounting substrates $1126_1$-$1126_N$ (collectively 1126) which may suitably be a printed circuit board (PCB), such as a flame resistant 4 (FR4 board). Each lamp may include three strings of LED chips. Each string of LEDs has a cathode and anode contact comprising a pair of the contacts 1102-1112. It will be recognized that single chip LED lamps, multiple chip lamps with all chips at the same wavelength, multiple chip lamps with chips of different wavelengths and lamps with strings of chips all exist so that myriad contact and drive current requirements are presented. The present invention provides flexibility in adapting to the many existing arrangements, and for adapting as future designs evolve.

The lamps $1100_1$-$1100_N$ are shown mounted on a larger printed circuit board 1150 which is shown cutaway in FIG. 11 for ease of illustration. A connector 1170 connects the contacts 1102-1112 to respective electrical connections, contacts, pads or traces 1154 and 1160 on the printed circuit board 1150 utilizing conductive connections $1153_{1-N}$, $1155_{1-N}$, $1157_{1-N}$, $1159_{1-N}$, $1161_{1-N}$, and $1163_{1-N}$ (collectively 1153-1163) which are part of the connector 1170. Connector 1170 may suitably comprise a flexible or moldable material that can be modified or manufactured to include electrical connections suitable for carrying the current needed by the lamp or lamps utilized by an application. Other examples are a stiff metal bent or otherwise shaped as needed with electrically isolated connectors thereon. Heat resistive plastic or ceramic with electrically isolated conductive traces may also be employed.

While the arrangement of FIG. 11 shows all strings of LEDs sharing common drive signals, it will be recognized that the present invention can be readily applied to individual drive currents for each string as discussed above.

While the present invention has been disclosed in the context of various aspects of a number of exemplary embodiments, it will be recognized that the invention may be suitably applied to other environments and adapted to other contexts consistent with the claims which follow. By way of example, while the present invention has been disclosed primarily in the context of exemplary LEDs and mounting arrangements, it will be recognized that the present teachings may be readily adapted to other LEDs and mounting arrangements, as well as, other lighting emitting devices, such as other light emitting semiconductor or solid state devices, such as laser diodes, and optoelectronic device chips, such as phototransistors and the like, by way of example. As one example, while examples of multiple contacts on one or more LED lamps are shown connected to one or more contacts on a printed circuit board and multiple contacts on a printed circuit board are shown connected to one or more contacts on one or more LED lamps, it will be recognized that the approach can be generalized to arrangements for connecting M×N contacts as needed in a particular lighting application. Further, while presently preferred materials and arrangements of exemplary LEDs are described herein with examples of materials and exemplary connections, other materials and connections may be provided to address the needs of particular lighting environments.

I claim:

1. An adaptive electrical connector for electrically connecting a first packaged lamp with plural LED strings, each string comprising one or more LED chips, the plural LED strings having plural top lamp contacts arranged in a first configuration requiring connection to plural board contacts on a board where the plural board contacts are arranged in a second configuration different from the first configuration, the adaptive connector comprising:
    a first group of lamp connectors comprising adaptive connector contacts corresponding to said plural top lamp contacts arranged in said first configuration on the light emitting device;
    a second group of board connectors comprising adaptive connector contacts corresponding to said plural board contacts arranged in said second configuration; and
    electrical connections connecting the first group of lamp connectors to the second group of board connectors.

2. The adaptive electrical connector of claim 1 wherein at least one of the plural top lamp contacts is connected by the electrical connections to multiple of the plural board contacts to facilitate the application of different drive currents.

3. The adaptive electrical connector of claim 1 wherein multiple of the plural top lamp contacts are connected by the electrical connections to one of the plural board contacts to facilitate the application of a common drive current.

4. The adaptive electrical connector of claim 1 wherein the plural top lamp contacts comprise plural interleaved cathode contacts and anode contacts.

5. The adaptive electrical connector of claim 1 further comprising:
    additional first group connectors, second group connectors and electrical connectors to electrically connect a second packaged LED lamp with plural LED strings to the board.

6. The adaptive electrical connector of claim 1, wherein the board comprises a printed circuit board and said plural board contacts comprise electrical traces arranged on a top surface of the printed circuit board.

7. The adaptive electrical connector of claim 1, wherein said adaptive electrical connector comprises a lead frame.

8. The adaptive electrical connector of claim 1 comprising:
    a body formed of heat resistive plastic with electrical isolation of electrical connectors which are implemented as conductive traces.

9. The adaptive electrical connector of claim 1, wherein the adaptive electrical connector is premounted on a substrate utilizing reflow soldering.

10. The adaptive electrical connector of claim 1 further comprising:
    a segment of heat dissipation material to provide additional heat dissipation.

11. The adaptive electrical connector of claim 1, wherein the board was designed for an LED lamp with a larger physical footprint, and the adaptive electrical connector adapts the first packaged lamp for mounting on the board without alteration of the board.

12. The adaptive electrical connector of claim 1 further comprising:
    a ceramic body.

13. The adaptive electrical connector of claim 1, wherein the plural top lamp contacts have a spaced relationship and said first group of lamp connectors have the same spaced relationship.

14. The adaptive electrical connector of claim 1 prepackaged with the first packaged lamp by reflow soldering the first group of lamp connectors to said plural top lamp contacts.

15. The adaptive electrical connector of claim 4 wherein the plural board contacts comprise a single board cathode contact and a single anode board contact.

16. The adaptive electrical connector of claim 6, wherein said traces have a spaced relationship, and said second group of board connectors have the same spaced relationship.

17. The adaptive electrical connector of claim 6 further comprising:
    a stiff body which provides physical mounting support for the first packaged lamp when the second group of board connectors are soldered to said plural board contacts.

18. The adaptive electrical connector of claim 11 wherein the electrical connections are separated together by an insulating material.

19. The adaptive electrical connector of claim 15 wherein the electrical connections deinterleave the plural top lamp contacts whereby all of the plural cathode contacts are thereby connected to the single board cathode contact.

20. The adaptive electrical connector of claim 15 wherein the electrical connections deinterleave the plural top lamp contacts whereby all of the plural anode contacts are thereby connected to the single board anode contact.

* * * * *